United States Patent [19]
Face, Jr. et al.

[11] Patent Number: 6,111,967
[45] Date of Patent: Aug. 29, 2000

[54] MULTI-SEGMENTED HIGH DEFORMATION PIEZOELECTRIC ARRAY

[76] Inventors: Samuel A Face, Jr., 1008 Magnolia Ave., Norfolk, Va. 23508; Norvell S. Rose, Jr., 3288 Doncaster Rd., Virginia Beach, Va. 23452

[21] Appl. No.: 08/963,415

[22] Filed: Nov. 3, 1997

Related U.S. Application Data

[63] Continuation-in-part of application No. 08/854,080, May 9, 1997.

[51] Int. Cl.[7] ............................................. H04R 25/00
[52] U.S. Cl. ............................ 381/190; 381/173; 310/367
[58] Field of Search ............................. 381/113, 114, 381/173, 174, 190, 191, 423, 424, FOR 162; 29/25.35; 310/367

[56] References Cited

U.S. PATENT DOCUMENTS

| | | | |
|---|---|---|---|
| 4,281,550 | 8/1981 | Erickson | 310/367 |
| 5,471,721 | 12/1995 | Haertling | 29/25.35 |
| 5,781,646 | 7/1998 | Face | 381/190 |

Primary Examiner—Huyen Le

[57] ABSTRACT

A multi-segmented flextensional transducer includes a plurality of electroplated electroactive members which deform in concert when energized by an electrical field. Each electroactive member has a convex surface at both ends. A connection member with opposing concave surfaces is disposed between adjacent electroactive members. The electroactive members are arranged such that the convex faces of each intermediate electroactive member engage a concave face of an adjacent connection member, thus forming a cooperative array or "train" of electroactive members and connection members. The opposite ends of the train of electroactive members and connection members is received by a frame which holds the end electroactive members in fixed relative position. The electroactive members are high deformation flextensional piezoelectric elements. When energized, each electroactive member individually deforms, and the entire array deforms in concert an amount significantly exceeding that of the individual electroactive members.

7 Claims, 7 Drawing Sheets

MULTI-SEGMENTED HIGH DEFORMATION PIEZOELECTRIC ARRAY

This is a continuation-in-part of co-pending application Ser. No. 08/854,080 filed May 9, 1997.

BACKGROUND OF THE INVENTION

1. Field of the Invention

The present invention relates generally to electrically active ceramic devices and, more particularly, to segmented flextensional piezoelectric devices arranged into a cooperative array.

2. Description of the Prior Art

Piezoelectric and electrostrictive materials develop a polarized electric field when placed under stress or strain. Conversely, they undergo dimensional changes in an applied electric field. The dimensional change (i.e., expansion or contraction) of a piezoelectric or electrostrictive material is a function of the applied electric field. Piezoelectric and electrostrictive devices (generally called "electroactive" devices herein) are commonly used as drivers, or "actuators", when subjected to an applied electric field, due to their propensity to deform under such electric fields. When used as an actuator, it is frequently desirable that the electroactive device be constructed so as to generate relatively large deformations and/or forces from the electrical input.

Various configurations of electroactive actuators have been proposed in the prior art in order to increase the amount of deformation and/or output force which can be generated by such devices. Direct mode actuators make direct use of a change in the dimensions of the ceramic material when activated, without amplification of the actual displacement, and are able to achieve a very small displacement (strain), which is, at best, only a few tenths of a percent. Indirect mode actuators achieve strain amplification via external structures. An example of an indirect mode actuator is a flextensional transducer. Prior flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, indirect mode actuators can exhibit several orders of magnitude greater displacement than can be produced by direct mode actuators.

The magnitude of the strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10% but can only sustain loads which are less than one pound. A conventional bimorph device includes an intermediate flexible metal foil sandwiched between two piezoelectric elements. Electrodes are bonded to each of the major surface of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20% (i.e. about twice that of unimorphs), but, like unimorphs, typically can only sustain loads which are less than one pound.

For certain applications of electroactive actuators known in the prior art, asymmetrically stress biased electroactive devices have been proposed in order to optimize the axial deformation of the electroactive material. In such devices, (which include, for example, "Rainbow" actuators (as disclosed in U.S. Pat. No. 5,471,721), "Thunder" actuators (as disclosed in U.S. Pat. No. 5,632,841), and other flextensional actuators) the asymmetric stress biasing produces a curved structure, typically having two major surfaces, one of which is concave and the other which is convex.

It is well known in the art that piezoelectric materials (such as PZT ceramics) are typically very brittle. When curvilinear piezoelectric elements made of such brittle materials are subjected to electrical energy, they tend to bend, and the convex surface of the element (i.e. at the "outside" of the bend) may undergo sufficient tension to cause the piezoelectric material to fracture. In most piezoelectric materials the achievable piezoelectric (i.e. output) force is proportional to the thickness of the element. However, because of the brittle nature of most PZT ceramics, only extremely thin (typically on the order of many thousandths of an inch thick) ceramics can, as a practical matter, be deformed into curved shapes; typically to relatively large radii of curvature, (or more particularly to radii of curvature which are necessarily a relatively large fraction of their unenergized radii of curvature); with relatively low piezoelectric output forces; and with relatively low total axial displacement.

Accordingly, it would be desirable to provide a curved electroactive ceramic device which, when electrically energized, is capable of large axial displacement, is capable of large radially directed output forces, and which is capable of deforming such that its energized radius of curvature is a relatively small fraction of the unenergized radius of curvature of the device.

SUMMARY OF THE INVENTION

The present invention provides an electroactive actuator, configured in a cooperative array of segmented piezoelectric elements and connection members which, when energized by an electric field, will deform with a high amount of axial displacement. This array, which is constructed into a curved shape having a normal (i.e. non-energized) radius of curvature will, when energized, axially deform such that the radius of curvature of the device becomes significantly smaller than the normal radius of curvature of the device.

A multi-segmented flextensional actuator constructed in accordance with the present invention comprises a series of piezoelectric ceramic elements and connection members, each of which ceramic elements has a convex surface at its opposite ends, and two substantially parallel major surfaces disposed between the two ends, and each of which connection members has two opposing concave surfaces adapted to engage the ends of adjacent ceramic elements. The ceramic elements are placed end-to-end with the connection members disposed between adjacent pairs of ceramic elements such that the convex faces of each intermediate ceramic element engage (i.e. nests within) concave faces of adjacent connection members. The ceramic elements at the two outboard ends of the composite structure are held in fixed spaced apart relationship by a rigid frame or other anchoring scheme. The major surfaces of the ceramic elements are electroded such that, when an electrical field is applied simultaneously across each of the ceramic elements, the entire arrayed structure axially deforms, while maintaining physical contact between adjacent ceramic elements.

Accordingly, it is a primary object of the present invention to provide an electroactive device in which segmented piezoelectric elements are arranged into a cooperative array.

It is another object of the present invention to provide a device of the character described in which each of the ceramic elements has a convex surface at one end and a concave surface at its opposite end, and two substantially parallel major surfaces disposed between the two ends.

It is another object of the present invention to provide a device of the character described in which the ceramic elements are placed end-to-end such that the convex face of each intermediate ceramic element engages (i.e. nests within) the concave face of an adjacent ceramic element.

It is another object of the present invention to provide a device of the character described in which the exterior ends of the ceramic elements at the opposite ends of the composite structure are held in fixed spaced apart relationship by a rigid frame or other anchoring scheme.

It is another object of the present invention to provide a device of the character described which, when an electrical field is applied simultaneously across each of the ceramic elements, the entire arrayed structure axially deforms, while maintaining physical contact between adjacent ceramic elements.

It is another object of the present invention to provide a device of the character described in which, when an electrical field is applied simultaneously across each of the ceramic elements, the displacement of an intermediately positioned ceramic element may be greater than the maximum strain (deformation) of any single one of said ceramic elements.

It is another object of the present invention to provide a device of the character described in which longitudinal (i.e. tangential) extension of a series of adjacent ceramic elements results in axial displacement of an intermediately positioned ceramic element.

It is another object of the present invention to provide a modification of the present invention wherein connection members are disposed between adjacent ceramic elements.

Further objects and advantages of my invention will become apparent from a consideration of the drawings and ensuing description thereof.

DESCRIPTION OF THE PREFERRED EMBODIMENT

Figure 1:
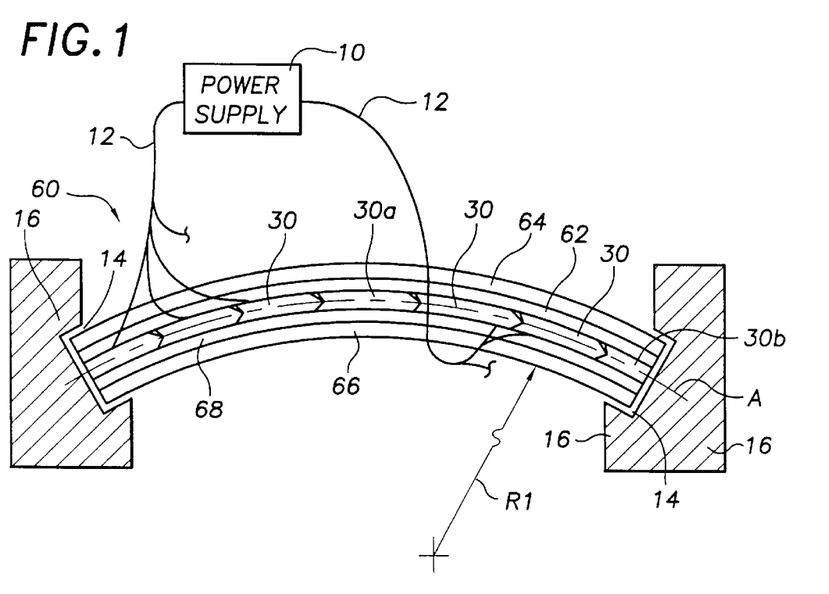
FIG. 1 is a elevation view showing a high deformation piezoelectric array constructed in accordance with the present invention, in a non-energized position.
Figure 2:
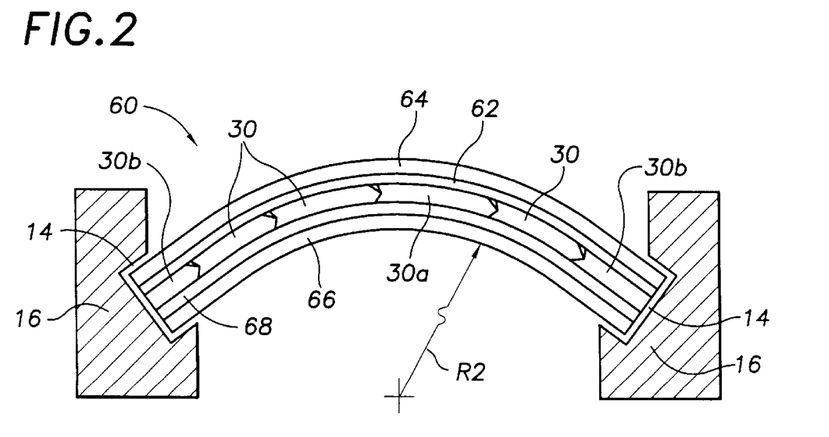
FIG. 2 is an elevation view of a similar to FIG. 1, but shown in an electrically energized position.

FIGS. 1 and 2 show a multi-segmented high deformation piezoelectric array (generally indicated as 60) constructed in accordance with the present invention. The multi-segmented high deformation piezoelectric array 60 comprises a series of piezoelectric ceramic elements 30 longitudinally aligned with each other along a deformable axis A. The plurality of individual piezoelectric ceramic elements 30, when energized by a common electrical power supply 10, simultaneously deform in unison, thereby causing the multi-segmented high deformation piezoelectric array 60 to deform as a single composite structure in a manner which will be described below. It will be seen that the total axial displacement realized by the central ceramic element 30a of the multi-segmented high deformation piezoelectric array 60 is far greater than the axial deformation of any of the individual ceramic elements 30 of the multi-segmented high deformation piezoelectric array 60.

For purposes of understanding the present disclosure, the following terms have the following meanings:

"Deformation" means the changing of shape (i.e. strain) of an element or a member.

"Displacement" means the changing of position of an element. Displacement of a surface of a member may be caused, for example, either by the member itself changing shape or by the entire member being moved from one position to another, or both.

"Longitudinal" deformation means deformation parallel to the longitudinal axis of an element. Longitudinal deformation of an individual ceramic element 30 refers to deformation which increases or decreases the length of the element 30. Thus, longitudinal deformation of a ceramic element 30 changes the distance between opposite ends (20 and 22) of the element.

"Thickness" deformation means deformation perpendicular to the longitudinal axis of an element and which either increases or decreases the thickness of the element. In the present invention, thickness of a ceramic element 30 is measured between opposing major surfaces (36 and 38) of the element.

"Central ceramic element" 30a simply refers to a ceramic element (of an array of longitudinally aligned series of ceramic elements) which is located halfway between the two ends of the array.

"Axial displacement" of a ceramic element 30 means displacement perpendicular a major surface of the element. Thus axial displacement of the central ceramic element 30a can be effected by varying the radius of curvature (R1 or R2) of the multi-segmented high deformation piezoelectric array 60, as illustrated in FIG. 1 and FIG. 2.

The multi-segmented high deformation piezoelectric array 60 preferably comprises a plurality of piezoelectric elements 30 positioned in a single layer, such that a convex end 22 of successive piezoelectric elements 30 engages a concave end 20 of an adjacent piezoelectric element 30. The plurality of piezoelectric elements 30 form a "train" of such elements, in which there are two end elements 30b and a central element 30a. The two end elements 30b of the multi-segmented high deformation piezoelectric array 60 are each pivotably held in place within a recess 14 of a frame member 16. The straight line distance from end to end of the multi-segmented high deformation piezoelectric array 60 is fixed due to the fixed distance between the two recesses 14.

Figure 3:
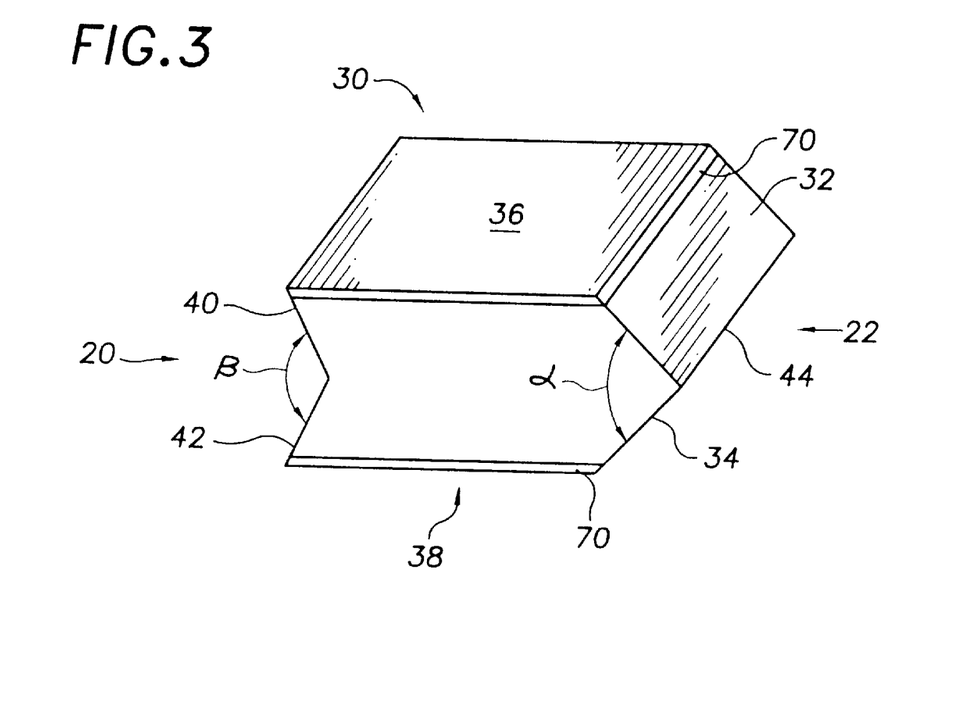
FIG. 3 is a perspective view showing the details of construction of a ceramic element used in the present invention.
Figure 5:
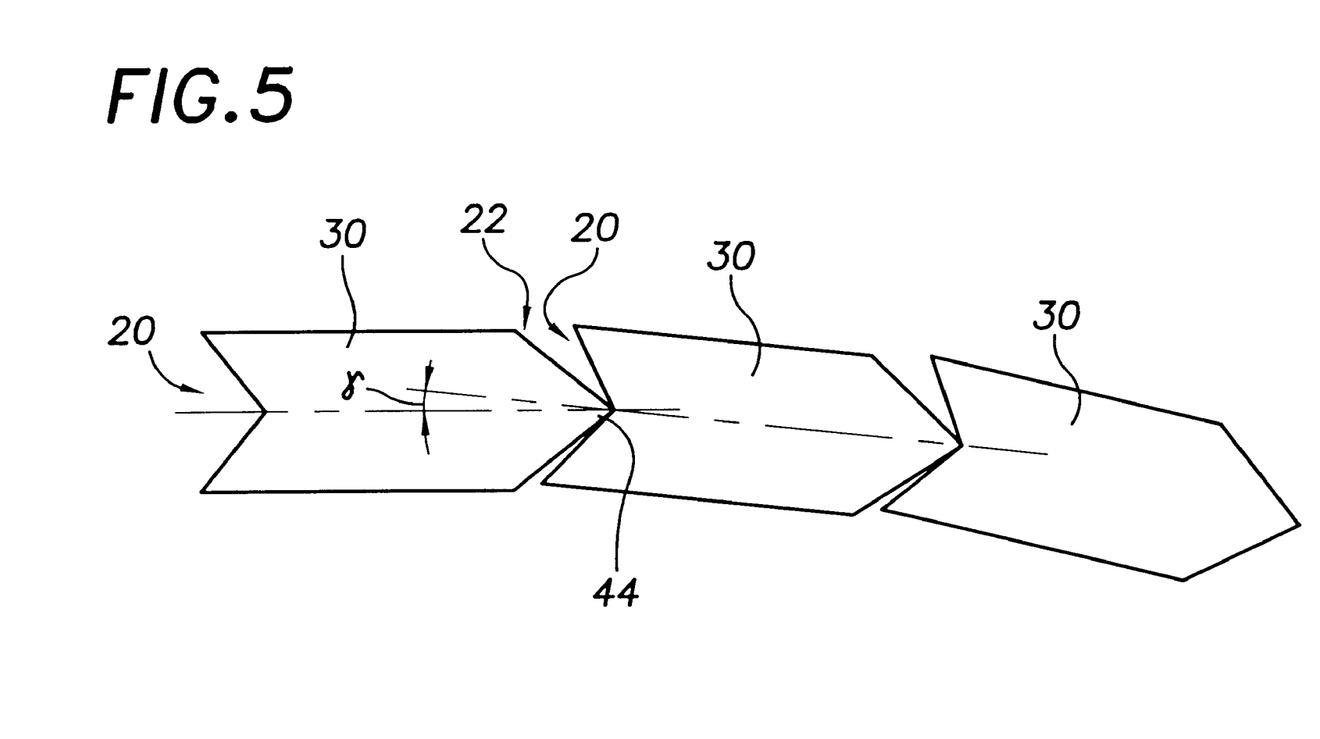
FIG. 5 is an elevation view showing in detail the manner in which adjacent ceramic elements engage each other in the preferred embodiment of the invention.

Referring now to FIG. 3: Each piezoelectric element 30 comprises a piezoelectric material (such as PZT ceramic) preferable having two substantially parallel major faces 36 and 38, a concave end 20 and a convex end 22. Each major face (36 and 38) of the piezoelectric element 30 is provided with an electrode 70 layer, which may be applied to the piezoelectric element 30, for example, by electroplating or by other common means. Each piezoelectric element 30 is electrically poled such that when a voltage potential is applied across the electroded surfaces 70, the element will longitudinally deform (i.e. either expand or contract, depending on the polarity of the voltage applied). In the preferred embodiment of the invention the convex end 22 of each piezoelectric element comprises two substantially planar faces 32 and 34 which form an angle (alpha) therebetween; and the concave end 20 preferably comprises two substantially planar faces 40 and 42 which form an angle (beta) therebetween. The angle (alpha) formed by the faces 32 and 34 at the convex end 22 of each piezoelectric element 30 is advantageously constructed to be smaller than the angle (beta) formed by the faces 40 and 42 at the concave end 20 of each piezoelectric element 30. It will be understood that the construction of the piezoelectric elements 30 herein described and illustrated in the drawings allows the convex end 22 of a piezoelectric element 30 to engage the concave end 20 of an adjacent piezoelectric element 30 such that the apex 44 of the former element 30 may maintain physical contact with concave face 20 of the latter element 30 over a range of engagement angles (gamma), as illustrated in FIG. 5.

In the preferred embodiment of the invention, the piezoelectric elements 30 are prestressed flextensional transducers. Prestressed flextensional transducers are desirable due to their durability and the relatively large deformation which such transducers are capable of developing; however, the present invention may be practiced with any electroactive element having the properties and characteristics herein described.

Continuous electrically conductive sheets 62 and 68 may be provided adjacent the major surfaces (36 and 38) of the array of piezoelectric elements 30. In the preferred embodiment of the invention the electrically conductive sheets 62 and 68 are each constructed of a thin metallic layer. An electrically conductive sheet (62, 68) is adjacent the electrodes 70 on each side of each piezoelectric element 30. Thus, the electrically conductive sheets 62 and 68 may each serve as an electrical bus, by which electrical energy may be distributed to each piezoelectric element 30 from the power supply 10 via electric wires 12 which are connected to the electrically conductive sheets 62 and 68.

In the preferred embodiment of the invention, the electrically conductive sheets 62 and 68 are relatively thin and deformable and are permanently attached by an adhesive (not shown) to each piezoelectric element 30. When voltage is applied to each piezoelectric element 30, the individual elements 30 longitudinally expand, which additionally strains the electrically conductive sheets 62 and 68 which are attached thereto. Because the electrically conductive sheets 62 and 68 used in the preferred embodiment of the invention are relatively thin and deformable, only an insignificant amount of energy is expended in deforming the electrically conductive sheets 62 and 68 as compared with the energy which is required to deform the piezoelectric elements 30, per se.

In a modified embodiment of the invention, the electrically conductive sheets 62 and 68 are constructed of a metal sheet which is sufficiently thick to be substantially longitudinally rigid but axially elastic, such that the two electrically conductive sheets 62 and 68, together, serve as a "bowed sheath" within which the axially deformable piezoelectric elements 30 are disposed. In this embodiment of the invention the piezoelectric elements 30 are not bonded to the electrically conductive sheets 62 and 68, but are permitted to slide against each other as the radius of curvature (R1, R2) of the "bowed sheath" varies.

In the preferred embodiment of the invention, flexible, preferably fluid-impermeable, sheath members 64 and 66 (for example urethane rubber) may be provided adjacent the electrically conductive sheet 62 and 68 to give form to the multi-segmented high deformation piezoelectric array 60 and to render it water-tight.

The electric power wires 12 may be connected directly to the electrode 70 of each piezoelectric element 30, or may alternatively be connected to the continuous conductive sheets 62 and 64 which is in contact with corresponding surfaces of each piezoelectric element of the multi-segmented high deformation piezoelectric array. In embodiments of the invention in which the electric wires 12 are connected directly to the electrodes 70 of each piezoelectric element 30, it is not necessary to additionally provide electrically conductive sheets 62 and 68, provided the apparatus comprises some other continuous member (such as sheathing material 64 and 66) to give form to the multi-segmented high deformation piezoelectric array 60.

It will be understood that when the piezoelectric elements 30 are subjected to an electric field (via wires 12) each individual piezoelectric element 30 longitudinally strains. Because the straight-line distance between the opposite ends of the multi-segmented high deformation piezoelectric array 60 (i.e. the chord) is fixed by its pivotal engagement with recesses 14 in frame 16, any elongation of the individual piezoelectric elements 30 will cause the length of the arc described by the array of piezoelectric elements 30, as a whole, to increase. Thus it will be understood that for an apparatus constructed in accordance with the present invention wherein the chord distance measured between the two frame recesses 14 remains constant, when the individual piezoelectric elements shown in FIG. 1 and having a radius of curvature R1 are electrically energized with a voltage having a first polarity, the arrayed piezoelectric elements 60 will assume a configuration having a smaller radius of curvature R1, as illustrated in FIG. 2. Similarly, when an apparatus constructed in accordance with the present invention, first being in the configuration illustrated in FIG. 2 and having a radius of curvature R2, is energized by a voltage of opposite polarity, the array of piezoelectric elements 30 will assume a configuration having a larger radius of curvature R2, as illustrated in FIG. 1.

It will be appreciated that in order for the present invention to operate as described herein above, it is necessary for each individual piezoelectric element 30 to remain in aligned contact with the adjacent piezoelectric element 30.

In the preferred embodiment of the invention, the apex 44 of each intermediate piezoelectric element 30 is always in direct contact with the concave end 20 of an adjacent piezoelectric element. It will also be appreciated that, inasmuch as the relative angle (gamma) between adjacent piezoelectric elements is in most instances not equal to zero, the longitudinal force applied by adjacent piezoelectric elements 30 to each other is typically not collinear. Accordingly, there is a tendency for adjacent piezoelectric elements 30 to axially "slip" relative to each other and to become disengaged. In the present invention adjacent piezoelectric elements 30 are prevented from disengaging with each other when longitudinally strained, by the nesting characteristic afforded by the respective concave and convex ends of the piezoelectric elements 30, and by the sheath members 64 and 66 and the electrically conductive sheets 62 and 68.

It will be appreciated that the high deformation piezoelectric array 60 may operate as described herein above regardless of whether the major faces 36 and 38 of the individual piezoelectric elements 30 are flat and parallel to each other. It is within the scope of the present invention for the individual piezoelectric elements 30 to be constructed such that the major faces of the piezoelectric elements 30 are non-parallel, and in particular they may be curved.

Figure 4:
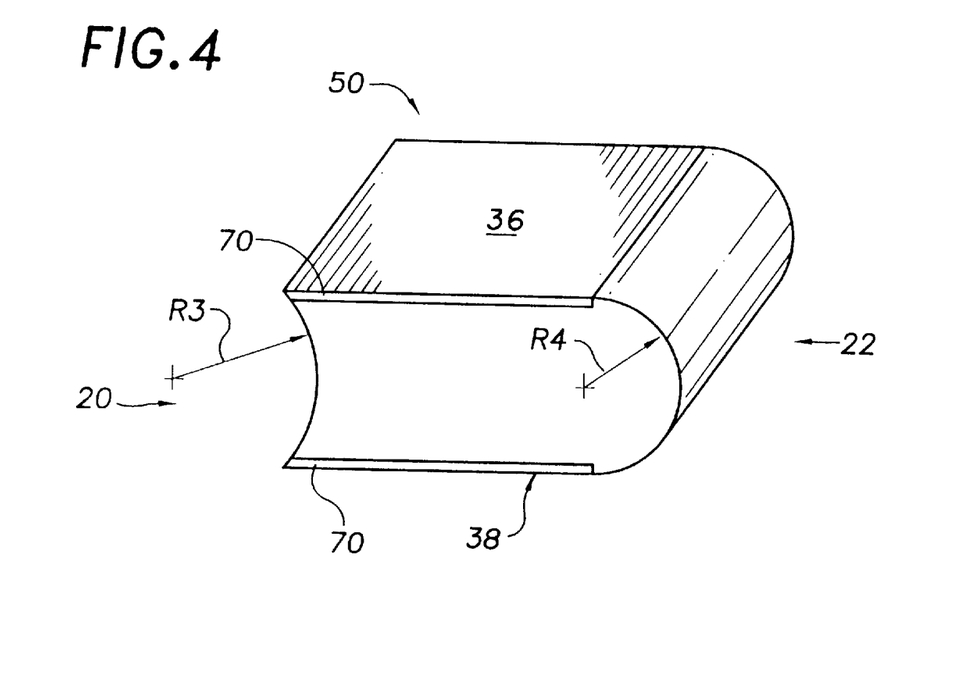
FIG. 4 is a perspective view showing the details of construction of a ceramic element used in a modification of the present invention.
Figure 6:
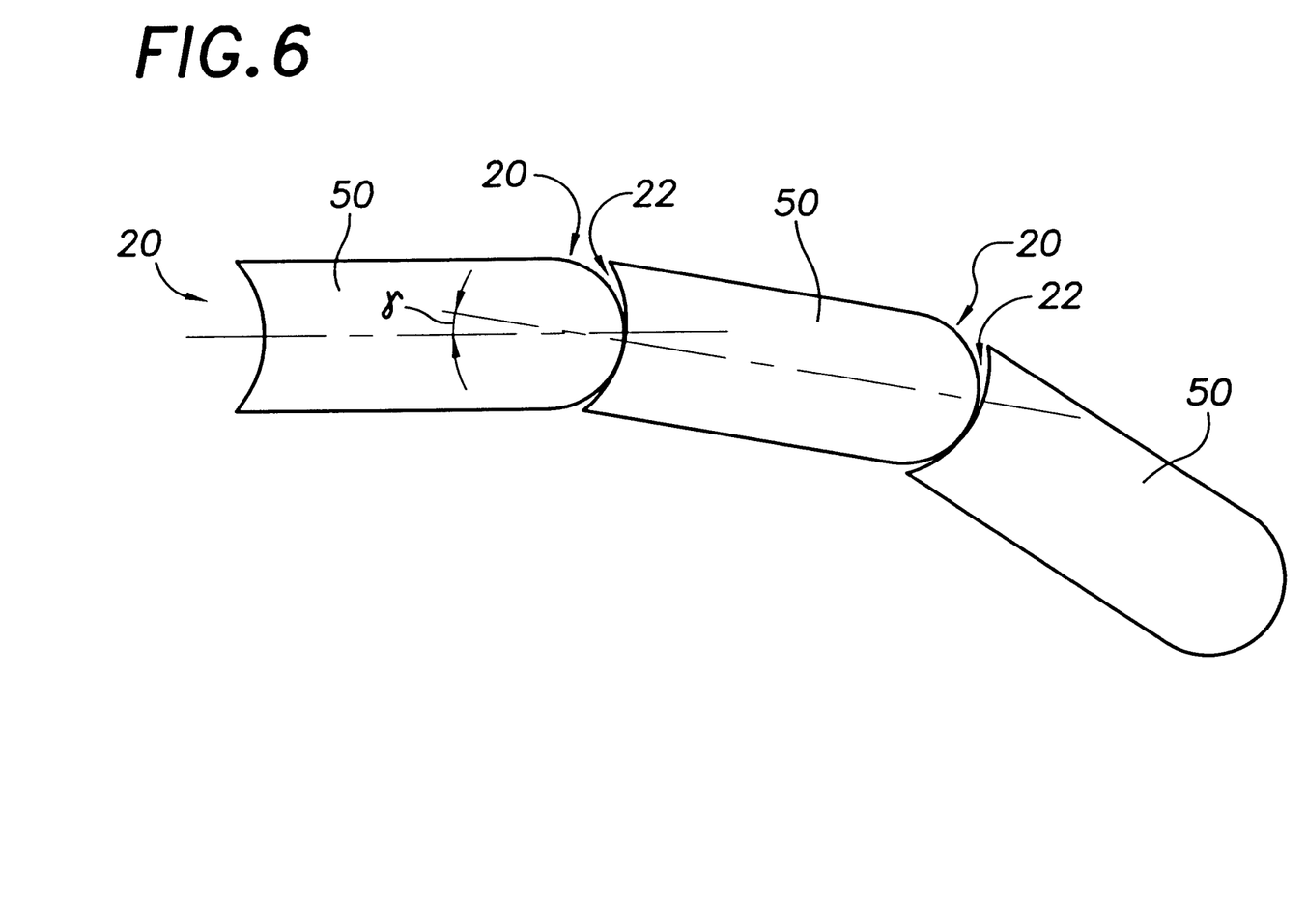
FIG. 6 is an elevation view showing in detail the manner in which adjacent ceramic elements engage each other in a modified embodiment of the invention.

In a modified embodiment of the present invention the concave 20 and convex 22 ends of the individual piezoelectric elements 50 may be curved surfaces as illustrated in FIG. 4 and FIG. 6, rather than piezoelectric elements 30 with planar surfaces as illustrated in FIG. 3 and FIG. 5. In this modification of the invention the piezoelectric elements 50 are constructed such that the radius R3 of the concave face 20 is greater than the radius R4 of the convex face 22, such that the relative angle (gamma) between adjacent piezoelectric elements 50 may vary while adjacent piezoelectric elements 50 maintain contact with each other.

Figure 7:
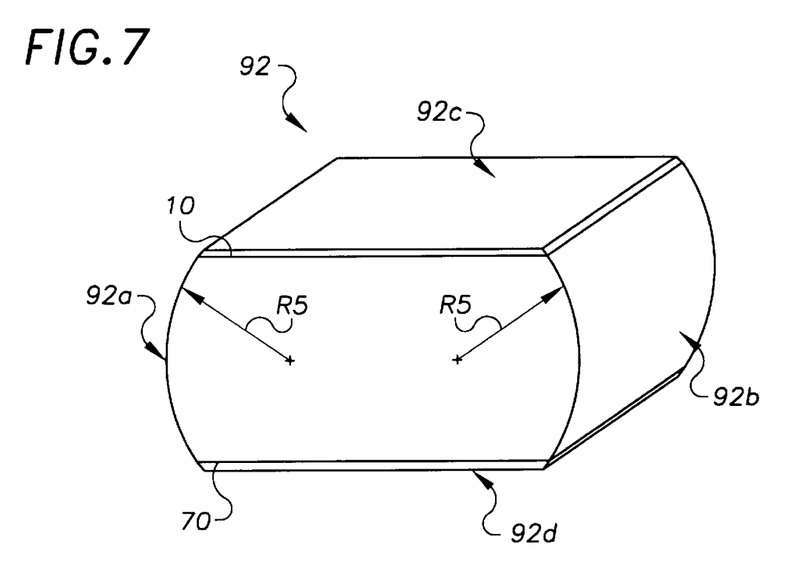
FIG. 7 is a perspective view showing the details of construction of a ceramic element used in a modification of the present invention.
Figure 8:
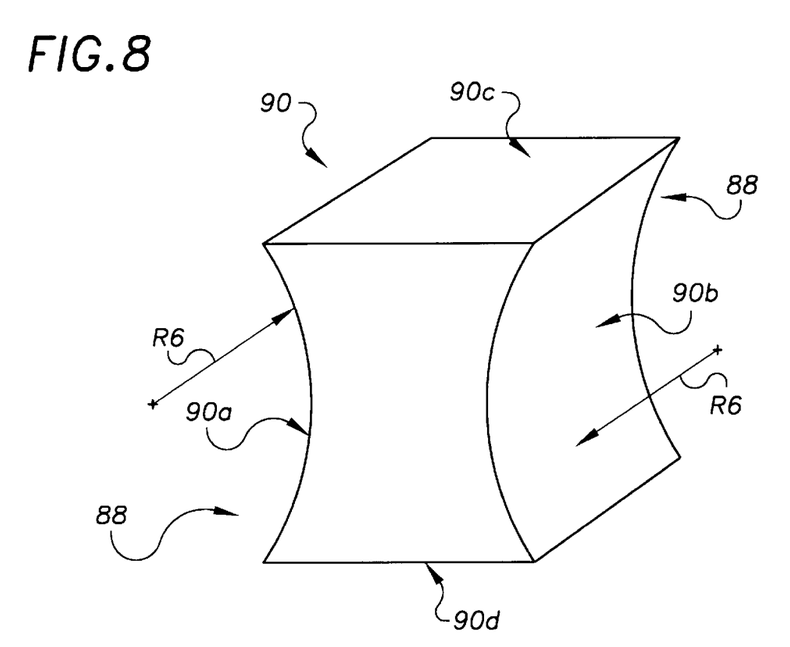
FIG. 8 is a perspective view showing the details of construction of a connection member used in a modification of the present invention.
Figure 9:
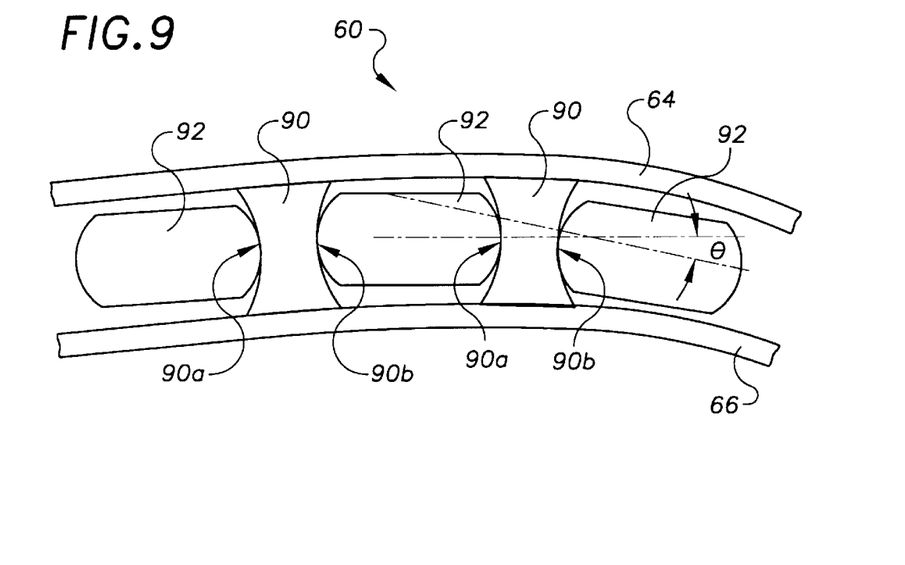
FIG. 9 is an elevation showing in detail the manner in which the ceramic elements engage the adjacent connection members in a modification of the present invention.

Now referring to FIGS. 7–9: In another modification of the present invention, connection members 90 may be disposed between adjacent piezoelectric elements 92. In this modification of the present invention, the engagement surfaces 90a and 90b of the connection members 90 are concave, and the non-engagement surfaces 90c and 90d of the connection member 90 are substantially planar, as shown in FIG. 8. The ends 92a and 92b of the piezoelectric elements 92 are convex, and two substantially parallel major surfaces 92c and 92d disposed between the two ends 92a and 92b are substantially planar as shown in FIG. 7. The engagement surfaces 90a and 90b of the connection member form substantially convex recesses 88 which are adapted to receive the ends 92a and 92b of the piezoelectric element 92, and thereby allow for advantageous engagement of the piezoelectric elements 92 with the connection members 90, as shown in FIG. 9, as will be described more fully herein below.

When the array 60 is energized, the advantageous construction of the connection members 90 allows convex ends 92a and 92b of the adjacent piezoelectric elements 92 to maintain contact with the concave engagement surface 90a and 90b of the connection members 90. The connection members 90 may comprise a relatively hard material, such as steel, aluminum or other metal, so that the connection members 90 maintain their shape during operation, or, the connection members 90 may comprise an elastomeric material so that they may advantageously conform to the shape of the adjacent piezoelectric elements 92, thereby creating more surface area contact between adjacent Connection members 90 and piezoelectric elements 92. In this modification of the invention the piezoelectric elements 92 are constructed such that the radius R6 of the concave faces 90a and 90b of the connection member 90 is greater than the radius R5 of the convex faces 92a and 92b of the piezoelectric elements 92, such that the relative angle (theta) between adjacent piezoelectric elements 92 and connection members 90 may vary while the piezoelectric elements 92 and the connection members 90 advantageously maintain contact with each other.

Figure 10:
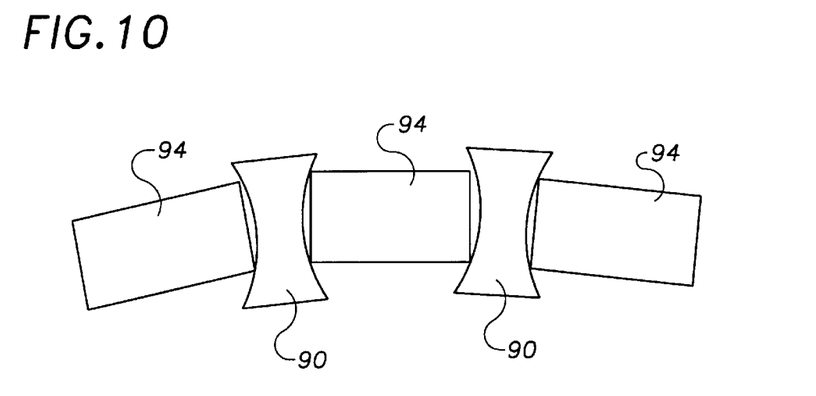
FIG. 10 is an elevation showing in detail the manner in which the ceramic elements engage the adjacent connection members in a modification of the present invention.

As shown in FIG. 10, in another modification of the invention, connection members 90 may be disposed between piezoelectric elements 94 which have ends with planar surfaces, thus allowing for ease of manufacture of the piezoelectric elements 94. In this modification of the invention, it is desirable that the connection members 90 be constructed of an elastomeric material so as to reduce stress concentrations at the ends of the piezoelectric elements 94.

Figure 11:
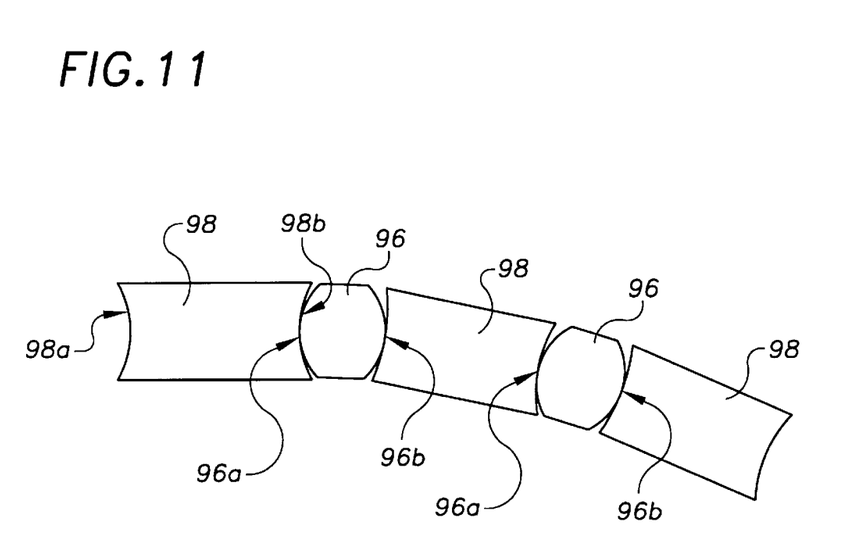
FIG. 11 is an elevation showing in detail the manner in which the ceramic elements engage the adjacent connection members in a modification of the present invention.

As shown in FIG. 11, in yet another modification of the present invention, the engagement surfaces 96a and 96b of the connection members 96 are convex, while the ends 98a and 98b of the piezoelectric elements 98 are concave. This construction allows for advantageous engagement of the piezoelectric elements 98 with the connection members 96. When the array 60 is energized, the advantageous construction of the connection members 96 allows concave ends 98a and 98b of the adjacent piezoelectric elements 98 to maintain contact with the convex engagement surface 96a and 96b of the connection members 96.

Figure 12:
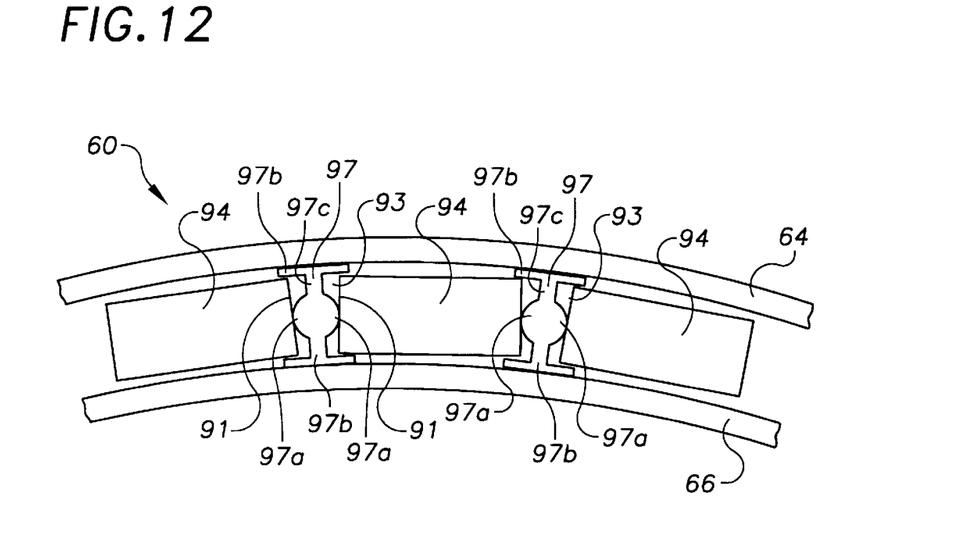
FIG. 12 is an elevation showing in detail the manner in which the ceramic elements engage the adjacent connection members in a modification of the present invention.

Referring now to FIG. 12: In another modification of the invention, the connection member 97 may be in the form of a modified I-beam having opposing convex bearing surfaces 97a disposed on a central bar 97c intermediately between the flanges 97b located at the opposite ends of the central bar 97c. The bearing surface 97a, flanges 97b and central bar 97c define a recess 93 which is adapted to receive and contain an end 91 of a piezoelectric element 94. The convex bearing surface 97a maintains contact with the (preferably flat/planar) end 91 of the piezoelectric element 94 during operation, regardless of the orientation of the piezoelectric element 94 relative to connection member 97.

The above description of the connection members 90 and 96, and the shape of the respective engagement surfaces 90a and 90b, and 96a and 96b, is not to be construed as a limitation on the present invention. It is within the scope of the present invention to provide connection members, and corresponding piezoelectric elements, which are constructed in any number of advantageous shapes.

In order to simplify the preceding disclosure, an embodiment of the present invention has generally been described wherein the multi-segmented high deformation piezoelectric array curves or bows within a single plane (e.g. the plane of the paper in FIGS. 1, 2, 5 and 6). However, it is within the scope of the present invention for the curvature of the device to be three-dimensional and for the multi-segmented high deformation piezoelectric array to be in a dome shape.

While the above description contains many specificities, these should not be construed as limitations on the scope of the invention, but rather as an exemplification of one preferred embodiment and a number of modifications thereof. Many other variations are possible, for example:

Multiple layers of multi-segmented high deformation piezoelectric arrays may be placed adjacent each other, each multi-segmented high deformation piezoelectric array layer being electrically insulated from the next (for example by a thin teflon sheet or the like), such that adjacent layers are allowed to longitudinally deform and displace at different rates. It will be understood that a system comprising such multiple layers of multi-segmented high deformation piezoelectric arrays can produce the same total thickness displacement but significantly greater axial force, than can be achieved by a single-layered multi-segmented high deformation piezoelectric array having an equivalent overall thickness.

A plurality of piezoelectric elements 30 (or 50) may be placed end-to-end on a common pre-stressing sheet (such as aluminum, steel or stainless steel), and bonded to the common conductive sheet by a polyimide (such as "LaRC-si" as developed by N.A.S.A.), by heating and subsequently cooling the components, so as to bond each piezoelectric element in place upon the conductive sheet and pre-stress each of the ceramic elements at the same time.

The electric supply need not be "common" to all of the individual piezoelectric elements 30. Different piezoelectric elements 30 may be electrically energized with different voltages.

The piezoelectric elements (30, 50) may be flextensional actuators or direct mode piezoelectric actuators.

The apex (44) may be curved, (i.e. have a radius).

A bearing material may be disposed between the concave 20 and convex 22 ends of mating piezoelectric elements 30 in order to reduce friction and wearing of one element against the next.

Double concave-ended ceramic elements may be positioned adjacent double convex-ended ceramic elements.

Accordingly, the scope of the invention should be determined not by the embodiment illustrated, but by the appended claims and their legal equivalents.

We claim:

1. A flextensional transducer comprising:

a deformable member having first and second ends, said deformable member comprising:
   a first electroactive member;
      wherein said first electroactive member has opposing first and second major surfaces;
      and wherein said first electroactive member has opposing first and second minor surfaces;
      said first electroactive member comprising a first electrode disposed on said first major surface of said first electroactive member;
      and said first electroactive member comprising a second electrode disposed on said second major surface of said first electroactive member;
   a second electroactive member;
      wherein said second electroactive member has first and second opposing major surfaces;
      and wherein said second electroactive member has first and second opposing minor surfaces;
      said second electroactive member comprising a third electrode disposed on said first major surface of said second electroactive member;
      and said second electroactive member comprising a fourth electrode disposed on said second major surface of said second electroactive member;

a connection member having first and second portions, said connection member disposed between said first electroactive member and said second electroactive member;

wherein said first minor surface of said first electroactive member is engaged with said first end portion of said connection member;

and wherein said second minor surface of said second electroactive member is engaged with said second end portion of said connection member.

2. The transducer according to claim 1, wherein said first end portion of said connection member comprises a substantially concave recess adapted to receive said first minor surface of said first electroactive member;

and wherein said second end portion of said connection member comprises a substantially concave recess adapted to receive said first minor surface of said second electroactive member.

3. The transducer according to claim 2, further comprising anchoring means, said anchoring means comprising first and second frame members;

wherein said first end of said deformable member is connected to said first frame member;

and wherein said second end of said deformable member is connected to said second frame member;

whereby said anchoring means holds said first and second ends of said deformable member a fixed distance apart.

4. The transducer according to claim 3, further comprising energizing means for electrically energizing said deformable member;

wherein said energizing means is in electrical communication with said first, second, third and fourth electrodes.

5. The transducer according to claim 4, further comprising a first conductive member connected to said first electrode and said third electrode;

and a second conductive member connected to said second electrode and said fourth electrode.

6. The transducer according to claim 4, further comprising means for enclosing said deformable member, said means for enclosing said deformable member comprising a sheathing member positioned adjacent to said first major face of said first electroactive member and said first major face of said second electroactive member.

7. The transducer according to claim 6, wherein said first and second electroactive members each comprise a piezoelectric material.

* * * * *